(12) United States Patent
Liao

(10) Patent No.: US 10,446,957 B2
(45) Date of Patent: Oct. 15, 2019

(54) RETAINER ASSEMBLY FOR USE WITH CONNECTOR AND METHOD MAKING THE SAME

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Fang-Jwu Liao, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/209,985

(22) Filed: Dec. 5, 2018

(65) Prior Publication Data

US 2019/0173204 A1    Jun. 6, 2019

(30) Foreign Application Priority Data

Dec. 5, 2017  (CN) .................... 2017 2 1673790 U
Dec. 5, 2017  (CN) .................... 2017 2 1674187 U

(51) Int. Cl.
*H01R 12/70* (2011.01)
*H01R 12/51* (2011.01)
(Continued)

(52) U.S. Cl.
CPC ......... *H01R 12/7058* (2013.01); *H01R 12/51* (2013.01); *H01R 12/7076* (2013.01);
(Continued)

(58) Field of Classification Search
CPC ............... H01R 12/51; H01R 12/7058; H01R 12/7076; H01R 13/502; H01R 13/62; H05K 7/12
See application file for complete search history.

(56) References Cited

U.S. PATENT DOCUMENTS 6,196,849 B1 * 3/2001 Goodwin ............. H05K 7/1061
439/571
6,699,047 B1 * 3/2004 McHugh ............. H01R 13/6278
439/330
(Continued)

FOREIGN PATENT DOCUMENTS

CN   206401562 U   3/2003
CN   103515763 B   12/2015
(Continued)

*Primary Examiner* — Adrian S Wilson
(74) *Attorney, Agent, or Firm* — Wei Te Chung; Ming Chieh Chang

(57) ABSTRACT

A retainer assembly includes a CPU and a retaining clip assemble together along an insertion/withdrawal direction perpendicular to a vertical direction of the CPU wherein the CPU forms a pair of sliding grooves, and the retaining clip forms a receiving space, an opening communicating the receiving space with an exterior, and a pair of retaining arms located by two sides of the receiving space and moveable along the pair of sliding grooves for allow the CPU to be received within the receiving space via said opening. The retaining arm may further optimally form a recess to receive a block of the CPU for retaining the CPU with regard to the retaining clip in the insertion/withdrawal direction. The retaining clip may or may not be mounted to the printed circuit board on which an electrical connector is mounted.

20 Claims, 15 Drawing Sheets

(51) Int. Cl.
H05K 7/12 (2006.01)
H01R 13/62 (2006.01)
H01R 13/502 (2006.01)

(52) U.S. Cl.
CPC ........... H01R 13/502 (2013.01); H01R 13/62 (2013.01); H05K 7/12 (2013.01)

(56) References Cited

U.S. PATENT DOCUMENTS

| | | | | |
|---|---|---|---|---|
| 6,702,588 B1* | 3/2004 | McHugh | ............ | H01R 12/7064 439/331 |
| 7,342,496 B2* | 3/2008 | Muirhead | ................ | B29C 51/02 340/572.1 |
| 7,527,503 B1* | 5/2009 | Polnyi | .................. | H05K 7/1061 439/71 |
| 2004/0175986 A1* | 9/2004 | Liao | ..................... | H05K 7/1061 439/526 |
| 2004/0185687 A1* | 9/2004 | Liao | ..................... | H01R 13/631 439/68 |
| 2004/0248431 A1* | 12/2004 | Liao | ....................... | H01R 12/88 439/41 |

FOREIGN PATENT DOCUMENTS

| | | |
|---|---|---|
| CN | 103515764 B | 2/2016 |
| CN | 205104653 U | 3/2016 |

\* cited by examiner

RETAINER ASSEMBLY FOR USE WITH CONNECTOR AND METHOD MAKING THE SAME

BACKGROUND OF THE DISCLOSURE

1. Field of the Disclosure

The present disclosure relates to an arrangement between the CPU (Central Processing Unit) and the retaining clip which is used to load the CPU unto the electrical connector, and particularly to retain the CPU to the retaining clip by means of the IHS (Integrated Heart Spreader) of the CPU.

2. Description of Related Arts

U.S. Pat. Nos. 10,038,258 and 10,116,076 disclose a retaining clip use for holding the CPU for loading the CPU unto the housing of the electrical connector, disregarding whether the retaining clip is mounted to the printed circuit board or not. Anyhow, the engagement between the CPU and the retaining clip may not be perfect enough without risks of withdrawal.

An improved arrangement of the retainer assembly between the CPU and the retaining clip is desired.

SUMMARY OF THE DISCLOSURE

An object of the invention is to provide an arrangement between the retaining clip and the integrated heat sink of the CPU so as to allow the CPU to be assembled to the retaining clip along a direction perpendicular to a vertical direction of the CPU in a stable manner for further commonly loading upon a housing of the electrical connector wherein the retaining clip is either mounted or not mounted upon the printed circuit board.

To achieve the above object, a retainer assembly includes a CPU and a retaining clip assemble together along an insertion/withdrawal direction perpendicular to a vertical direction of the CPU wherein the CPU forms a pair of sliding grooves, and the retaining clip forms a receiving space, an opening communicating the receiving space with an exterior, and a pair of retaining arms located by two sides of the receiving space and moveable along the pair of sliding grooves for allow the CPU to be received within the receiving space via said opening. The retaining arm may further optimally form a recess to receive a block of the CPU for retaining the CPU with regard to the retaining clip in the insertion/withdrawal direction. The retaining clip may or may not be mounted to the printed circuit board on which an electrical connector is mounted. The retaining clip with the associated CPU is loaded into the housing of the electrical connector and commonly retained in the housing via a load plate of electrical connector.

Other objects, advantages and novel features of the disclosure will become more apparent from the following detailed description when taken in conjunction with the accompanying drawings.

DETAILED DESCRIPTION OF THE PREFERRED EMBODIMENT

Figure 1:
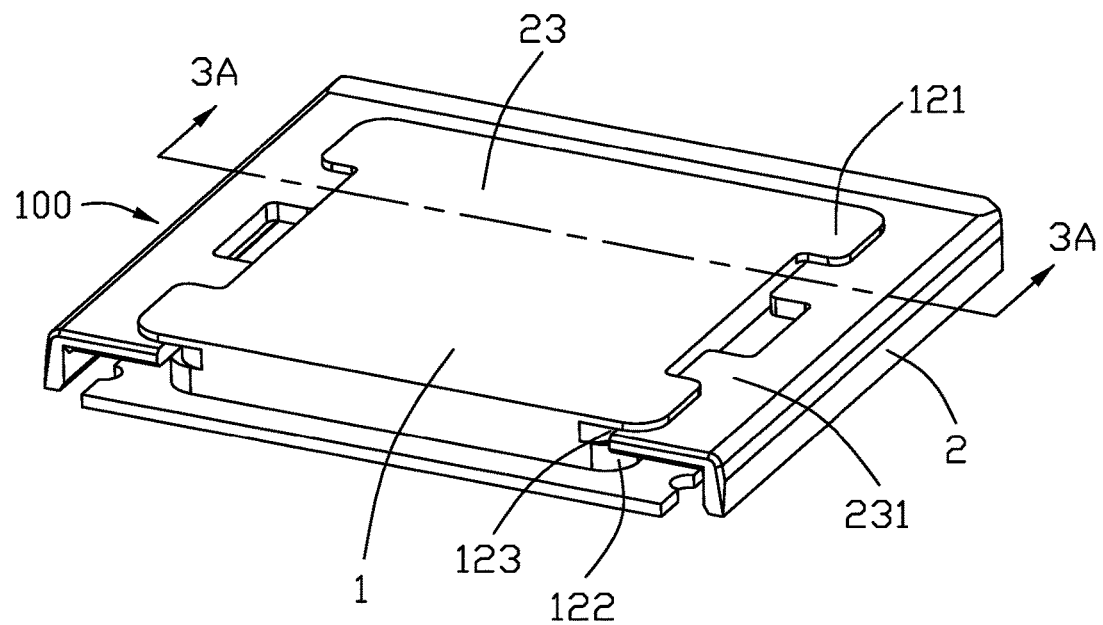
FIG. 1 is a perspective view of a retainer assembly according to a first embodiment of the invention.
Figure 2:
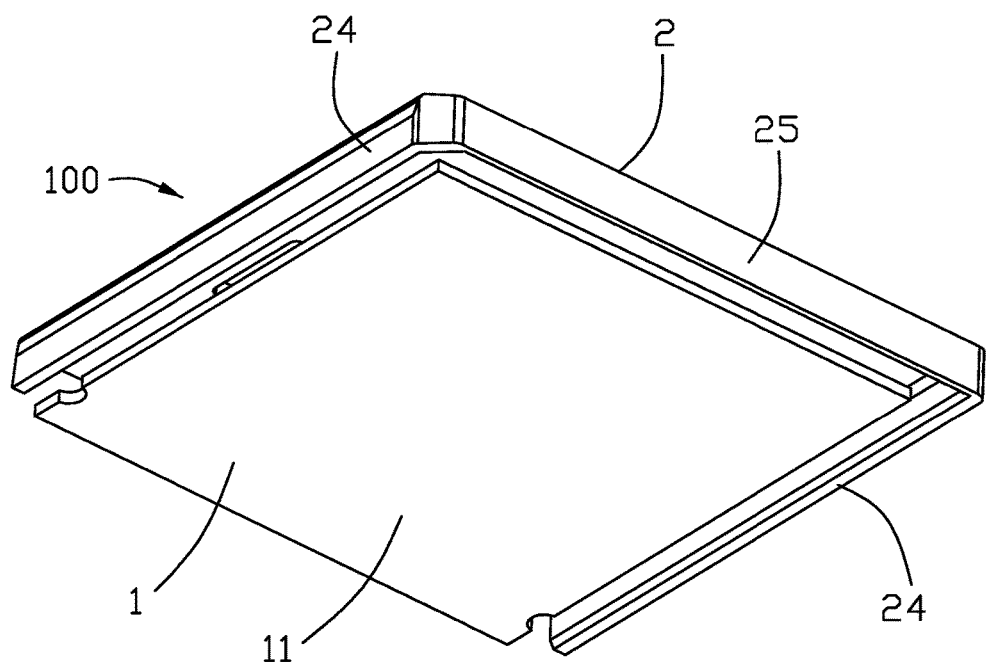
FIG. 2 is another perspective view of the retainer assembly of FIG. 1.
Figure 3:
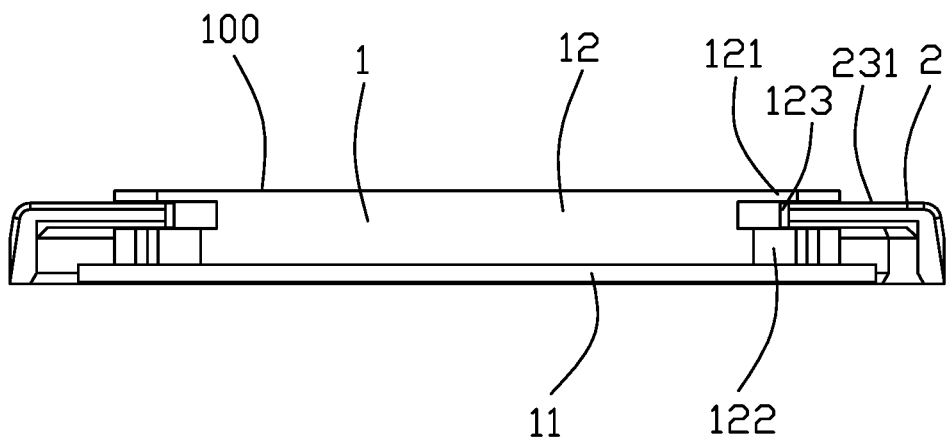
FIG. 3 is a front view of the retainer assembly of FIG. 1.
Figure 3A:
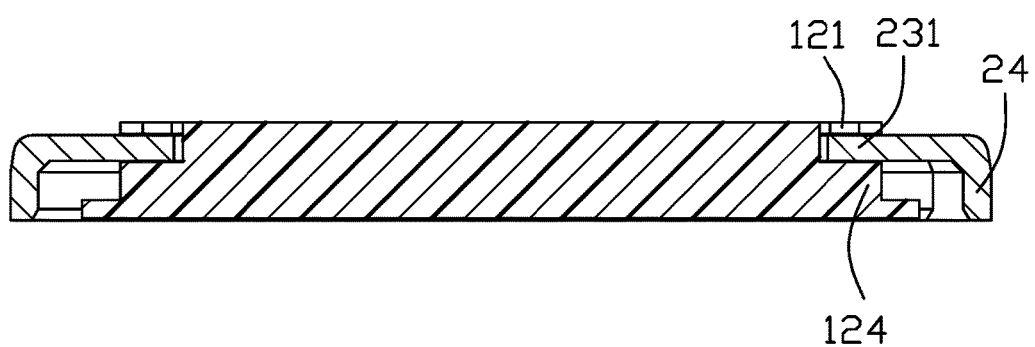
FIG. 3(A) is a cross-sectional view of the retainer assembly of FIG. 1.
Figure 4:
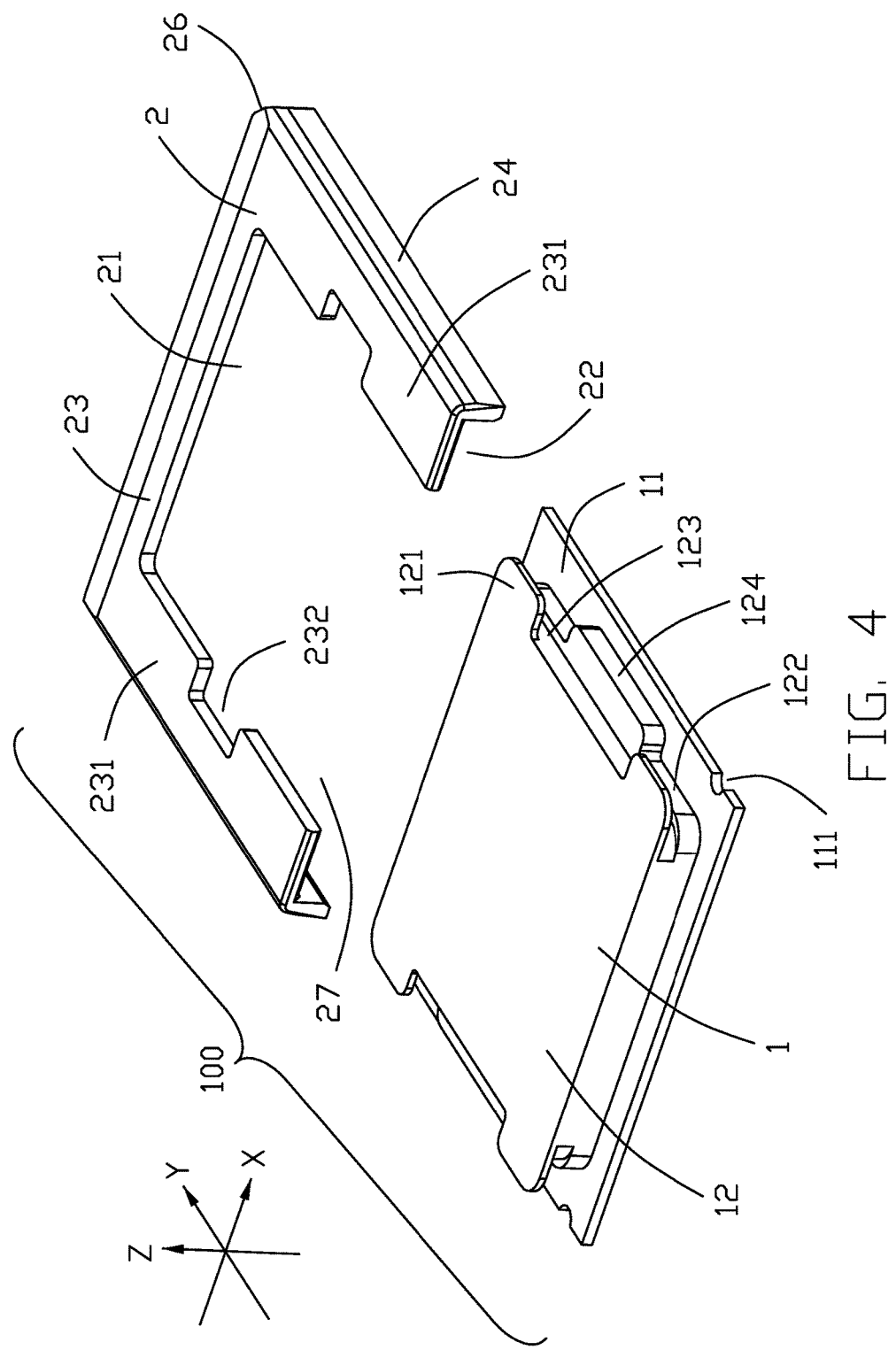
FIG. 4 is an exploded perspective view of the retainer assembly of FIG. 1.
Figure 5:
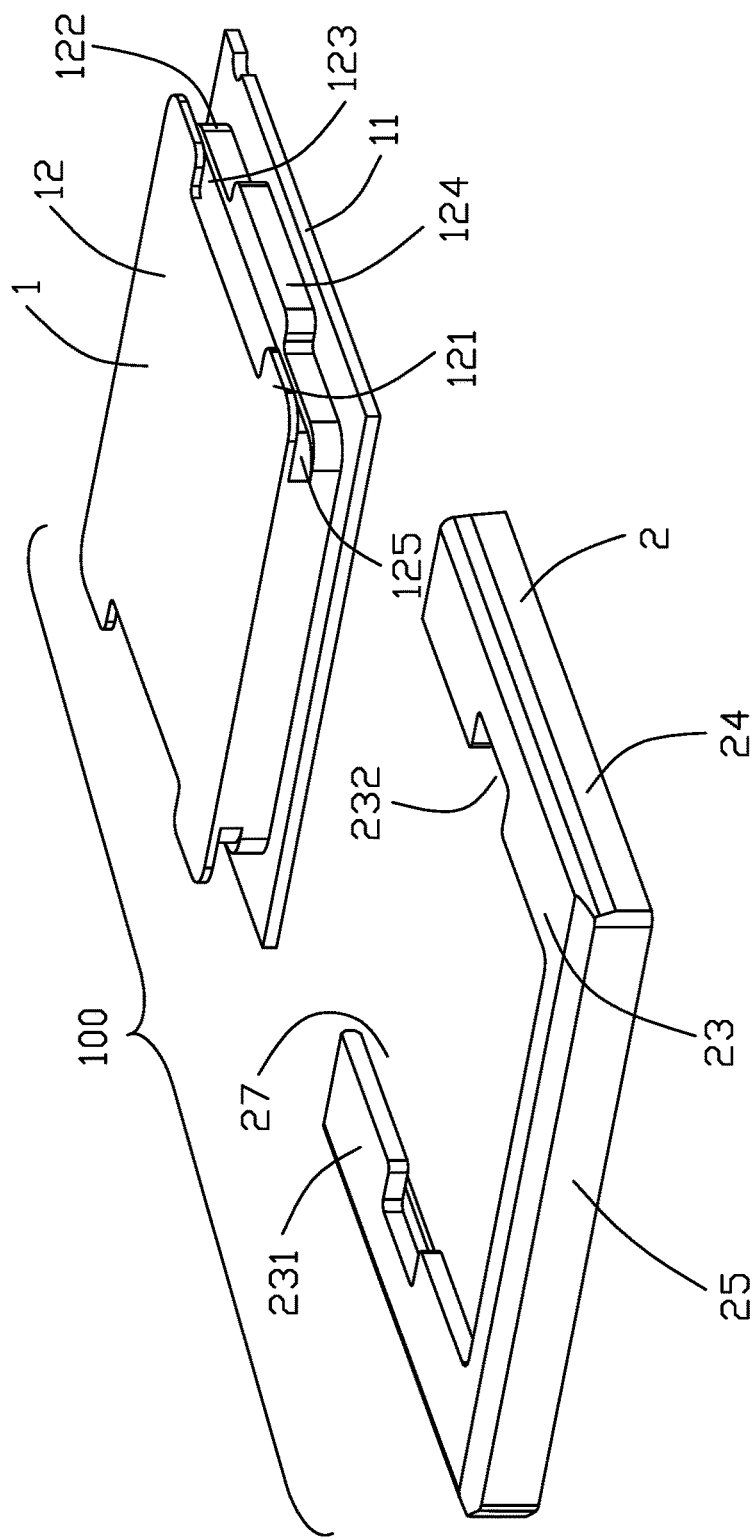
FIG. 5 is another exploded perspective view of the retainer assembly of FIG. 4.

Reference will now be made in detail to the embodiments of the present disclosure. The reference numerals are referred to the different embodiments, respectively.

A retainer assembly 100 includes a CPU 1 and the plastic retaining clip 2 holding the CPU 1. In this embodiment, the CPU 1 is sliding along the retaining clip 2 along an insertion/front-to-back direction Y perpendicular to a vertical direction Z of the CPU 2.

The CPU 1 includes a square base plate 11 and a central protrusion 12 upwardly extending from the base plate 11. A pair of notches 111 are formed in the base plate 11 for alignment with the positioning post of the corresponding electrical connector. The central protrusion 12 is thicker than the base plate 11 in the vertical direction. The central protrusion 12 includes two pairs of flanges 121 and two pairs of platforms 122 on two opposite sides and spaced from each other in the vertical direction Z. The two pairs of flanges 121 are spaced from each other in the front-to-back direction Y, and the two pairs of platforms 122 are as well. A pair of sliding grooves 123 are respectively formed between the two pairs of flanges 121 and the two pairs of platforms 122 in the vertical direction Z and on two lateral sides of the central protrusions 12 in a transverse direction X perpendicular to both the front-to-back direction Y and the vertical direction Z. The central protrusion 12 further forms a pair of lateral blocks 124 between two pairs of flanges 121 in the front-to-back direction Y. Notably, the lateral blocks 124 are for use with the loading plate of the electrical connector for pressing the CPU downwardly upon the housing of the electrical connector.

The retaining clip 2 includes a receiving space 21 and an opening 22 communicating the receiving space 21 with an exterior in the front-to-back direction Y. The retaining clip 2 includes a top wall 23, a pair of side walls 24 by two lateral sides of the top wall 23, and a rear wall 25 behind the receiving space 21. A chamfer 26 is formed on a corner of the rear wall 25 and one side wall 24 for orientation purpose.

The top wall 23 forms an center opening 27 to communicate with the receiving space 21, and a pair of retaining arms 231 by two lateral sides of the center opening 27. During assembling, the pair of retaining arms 231 respectively move along the pair of corresponding sliding grooves 123 to allow the CPU 1 to enter the receiving space 21 via the opening 22. A curved structure 125 is formed in the front end of each sliding groove 123 to guide the retaining arm 231 to enter thereinto. The central protrusion 12 extends through the center opening 27 and beyond the top wall 23. Notably, the retaining arm 231 is sandwiched between the pairs of flanges 121 and the pairs of platforms 122 in the vertical direction Z. The retaining arm 231 forms a recess 232 communicating with the center opening 27 in the transverse direction X and aligned with the corresponding lateral block 124 so as to allow a pressing section of the load plate of the electrical connector to downwardly press the lateral block 124 when assembled.

Notably, the central protrusion 12 may include an IHS (Integrated Heat Spreader) so as to form the required configuration including the pair of flanges, the pair of platforms and the pair of lateral blocks 124. In this embodiment, when assembled, the base plate 11 is spaced from the retaining clip 2 so as not to influence the engagement between the positioning posts of the housing of the electrical connector and the notches 111 of the base plate 11.

Figure 6:
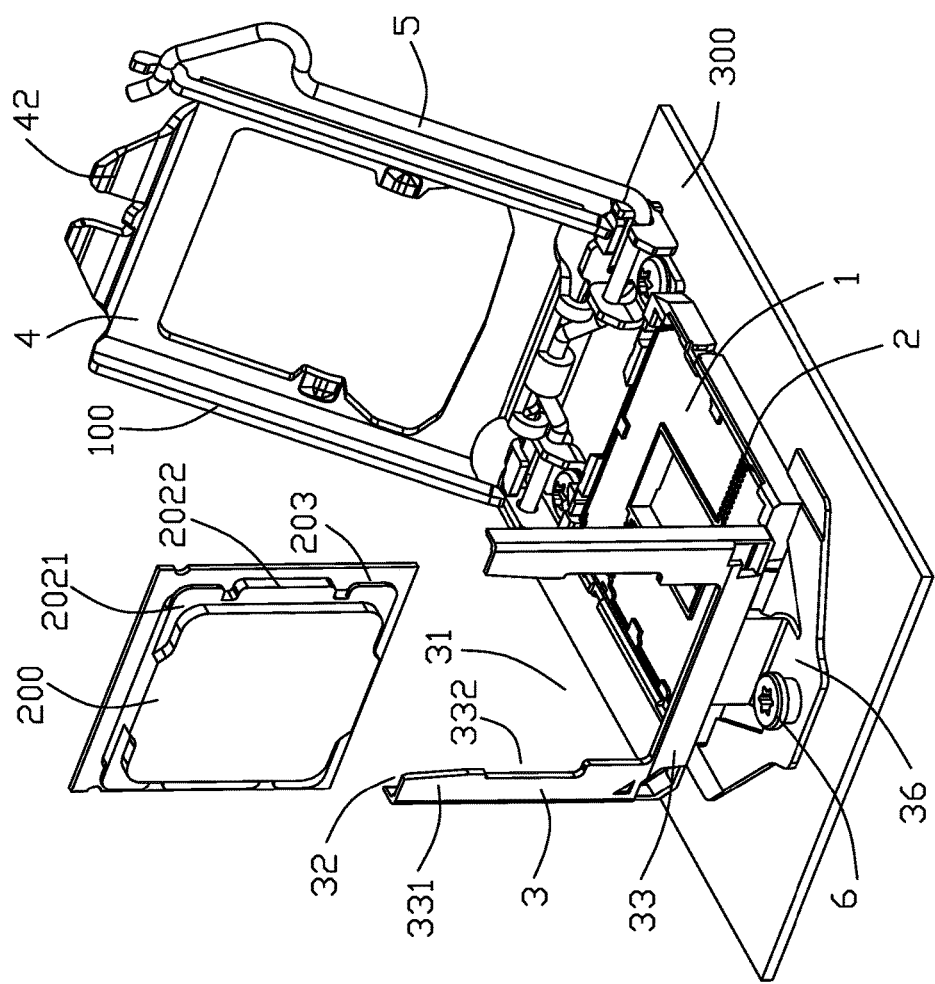
FIG. 6 is a perspective view of an electrical connector assembly according to a second embodiment of the invention wherein in the retainer assembly the CPU is removed from the retaining clip.
Figure 7:
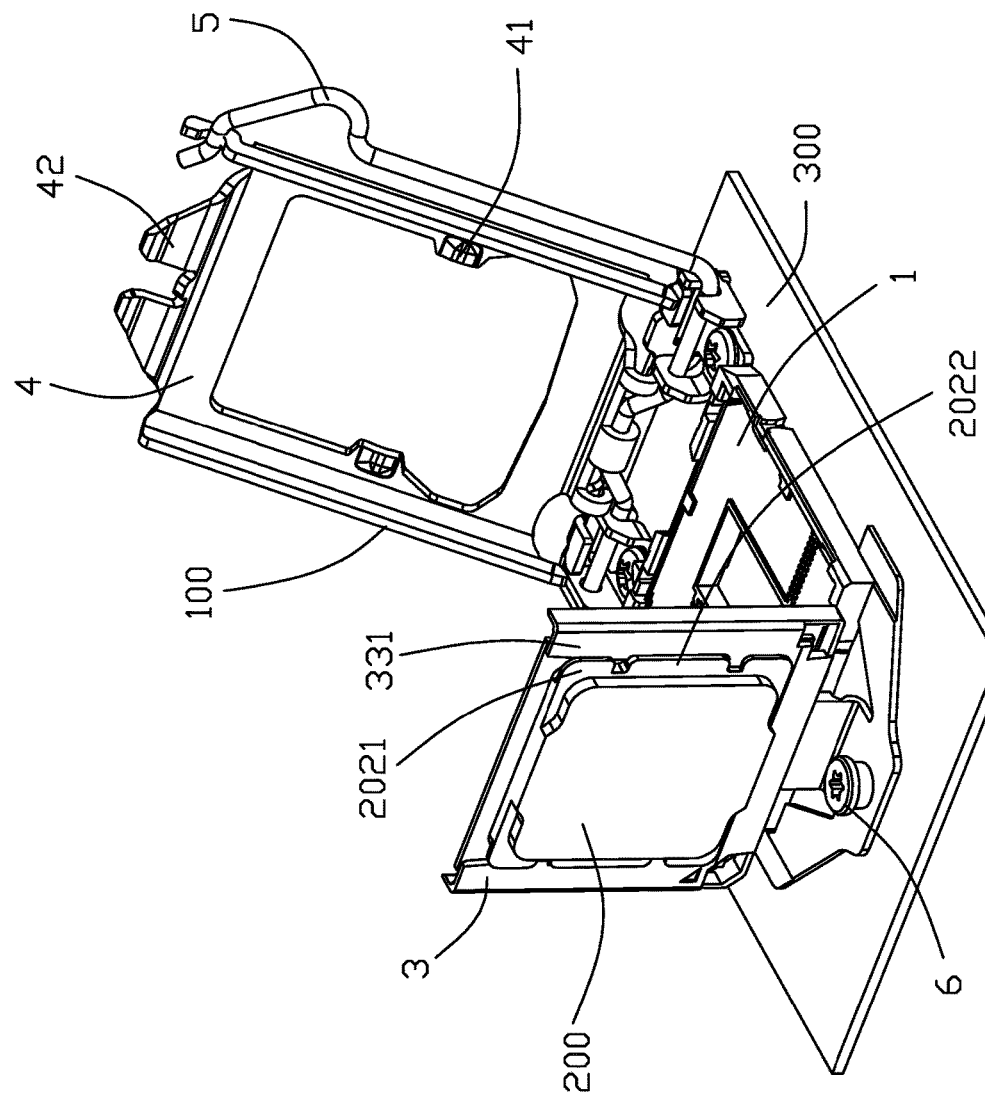
FIG. 7 is a perspective view of the electrical connector assembly of FIG. 6 wherein the CPU is assembled to the retaining clip in the retainer assembly in an open position.
Figure 8:
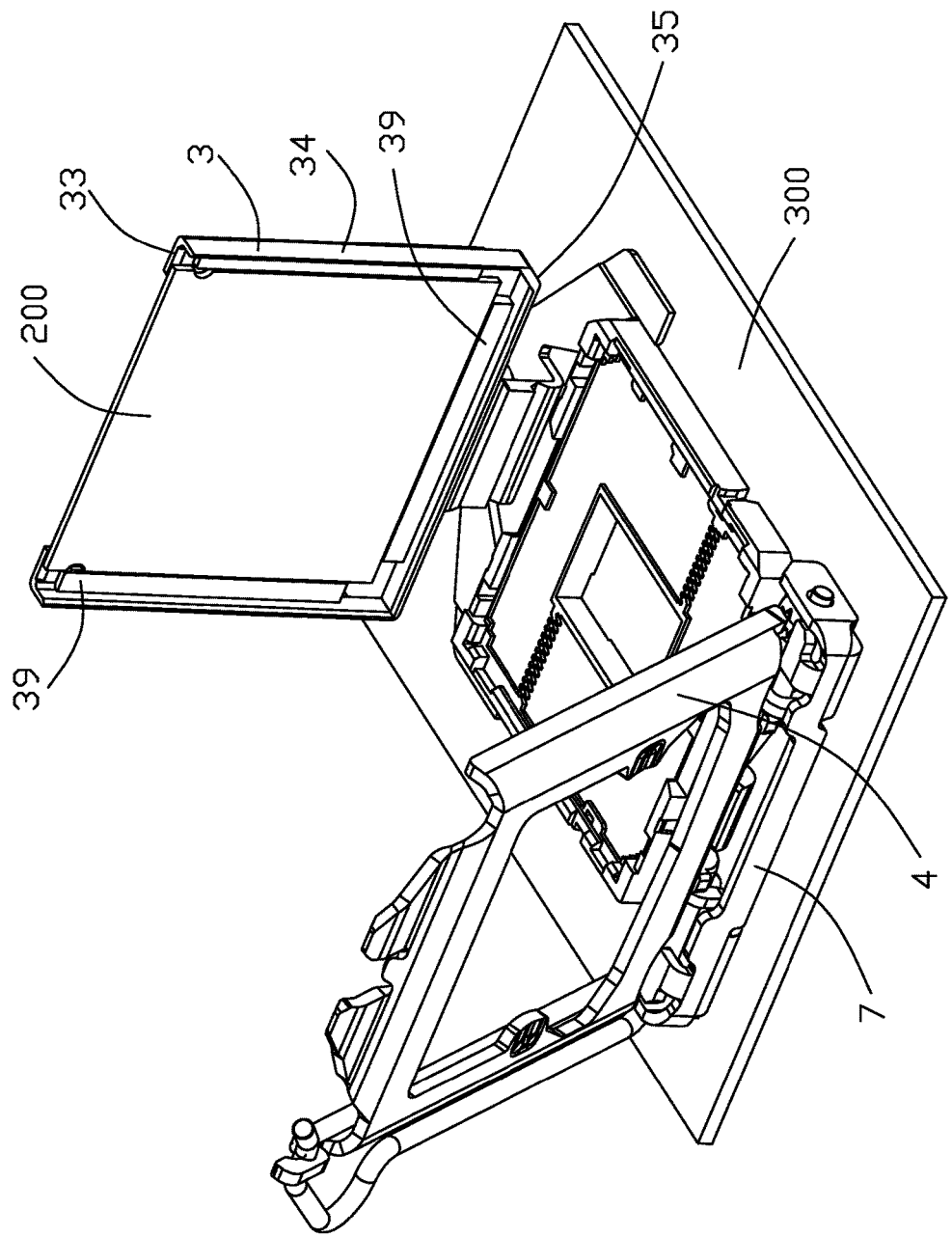
FIG. 8 is another perspective view of the electrical connector assembly of FIG. 7.
Figure 9:
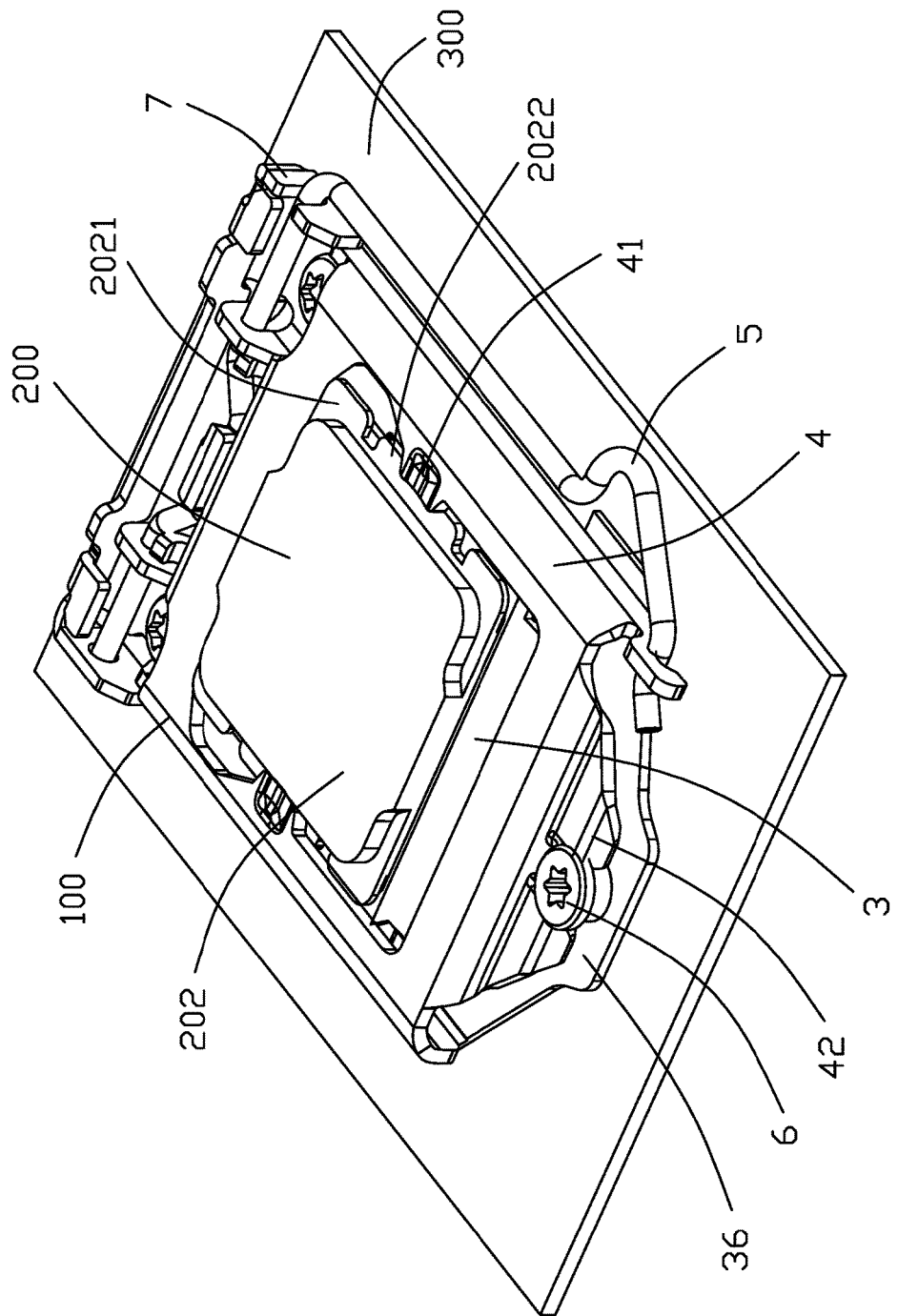
FIG. 9 is a perspective view of electrical connector assembly of FIG. 6 wherein the retaining assembly is in a closed position.
Figure 10:
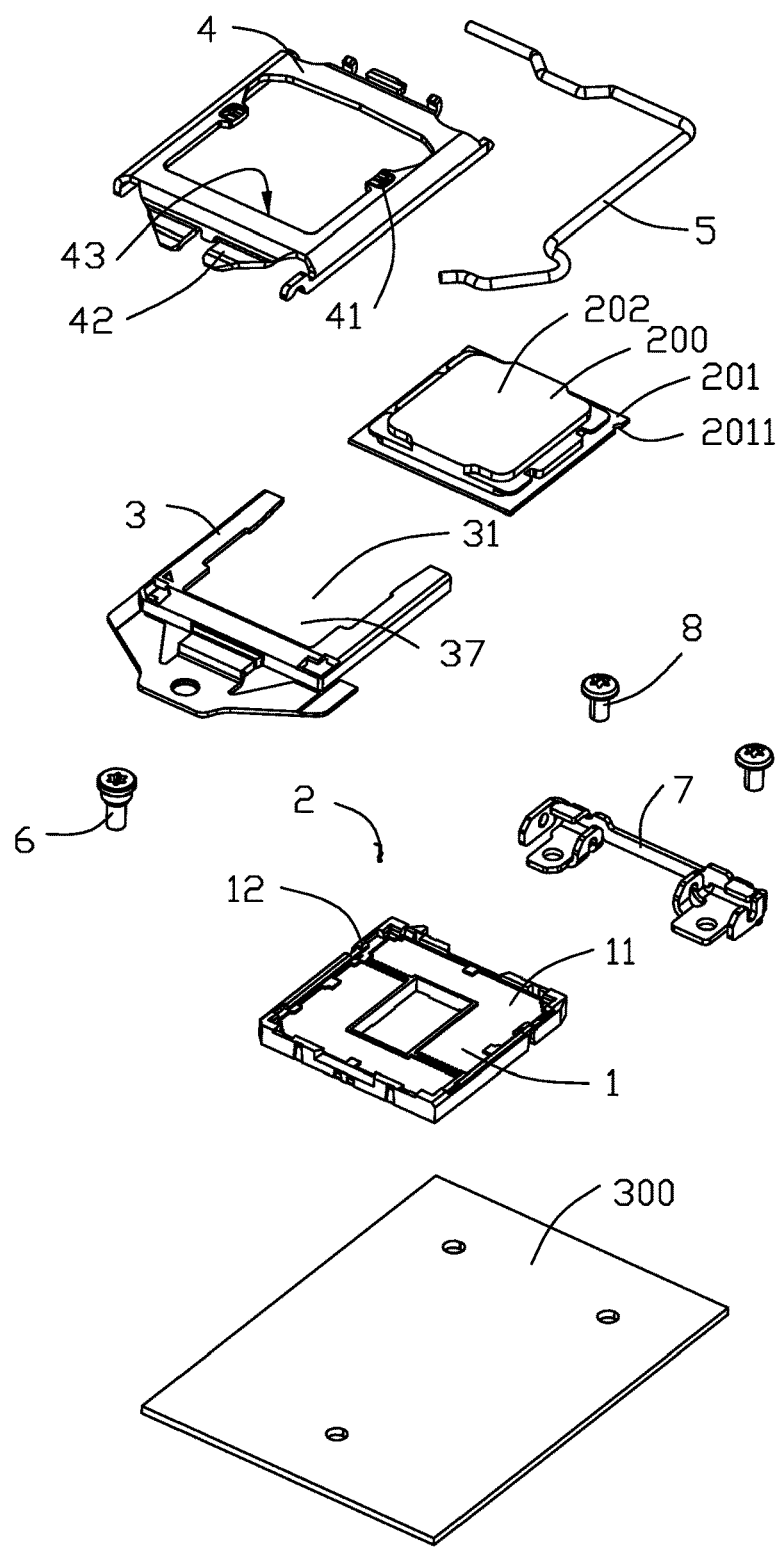
FIG. 10 is an exploded perspective view of the electrical connector assembly of FIG. 6.
Figure 11:
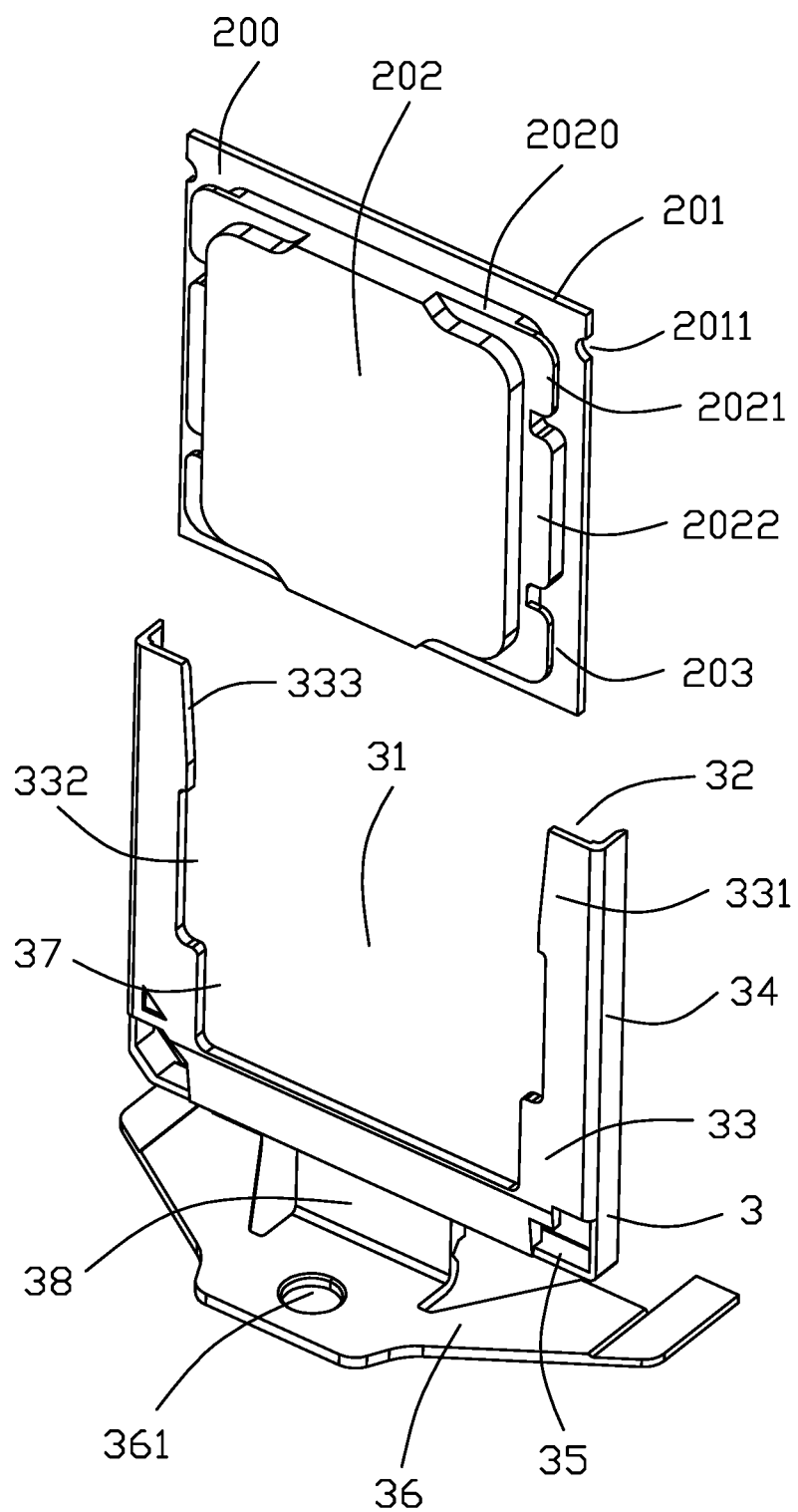
FIG. 11 is an exploded perspective view of the retainer assembly of the electrical connector assembly of FIG. 6 wherein the retainer assembly is in an open position.
Figure 12:
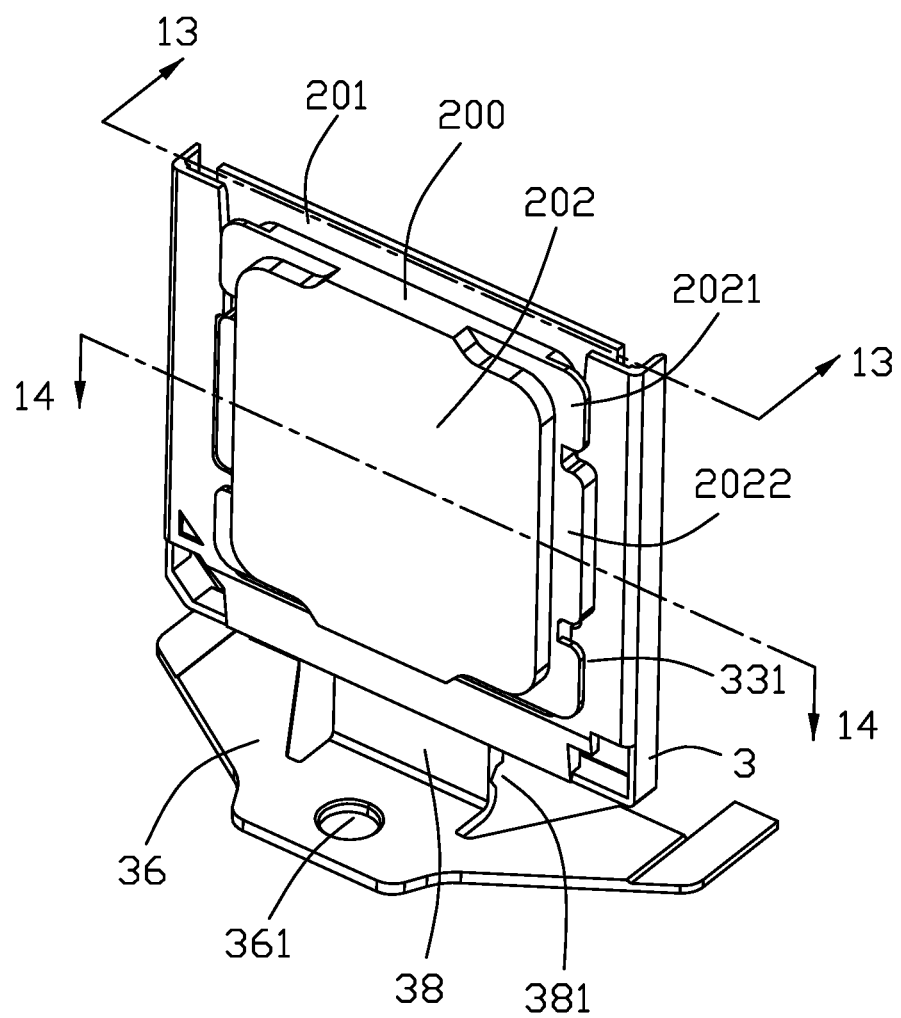
FIG. 12 is an assembled perspective view of the retainer assembly of the electrical connector assembly of FIG. 11.
Figure 13:
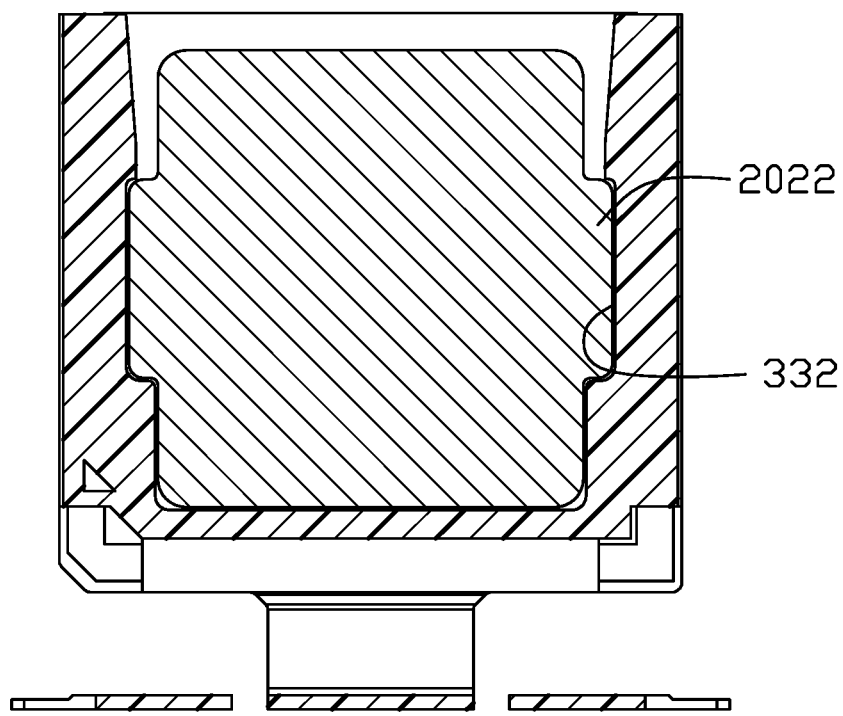
FIG. 13 is a cross-sectional view of the assembled retainer assembly of the electrical connector assembly of FIG. 12.
Figure 14:
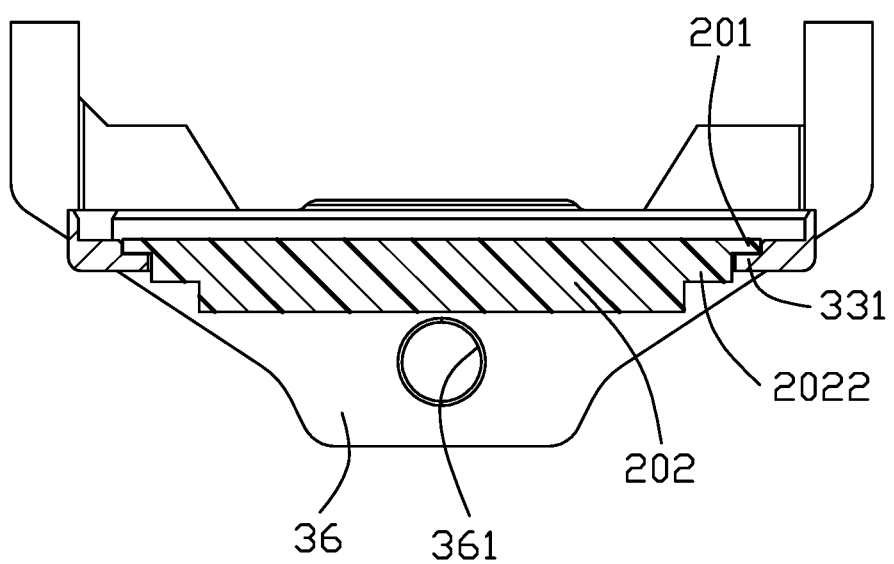
FIG. 14 is another cross-sectional view of the assembled retainer assembly of the electrical connector assembly of FIG. 12.

FIGS. 6-14 are related to a second embodiment of the invention, showing the electrical connector which are not shown in the first embodiment but described. An electrical connector assembly includes an electrical connector 100 mounted upon a printed circuit board 300, and a CPU 200 loaded into the connector 100. The electrical connector 100 includes an insulative housing 1, a plurality of contacts 2 retained in the housing 1 for contacting the CPU 200, a retaining clip 3 for holding the CPU 200, a metallic load plate or cover 4 for downwardly pressing the CPU 200, and a lever 50 moving the load plate 4, and a fixing piece 6 for securing both the load plate 4 and the retaining clip 3 upon the printed circuit board 300.

The CPU 200 includes a square base plate 201 and a central protrusion 202 extending upwardly from the base plate 201, and a pair of notches 2011 formed in the lateral sides of the base plate 201 for engagement with the corresponding positioning posts or blocks 12 in the housing 1 for precisely positioning the CPU 200 upon the housing 1. The CPU 200 includes a pair of lateral extensions 2020 located respectively on opposite lateral sides of the central protrusions 202 and including a pair of lateral blocks 2022 located between two pair of flanges 2021 in the front-to-back direction, respectively. The flange 2021 is spaced from the base plate 201 while the lateral block 2022 is linked with the base plate 201. The load plate 4 includes a pair of pressing sections 41 downwardly abutting against the lateral blocks 2022 for retaining the CPU 200 upon the housing 1. Notably, a sliding groove 203 is formed between the base plate 201 and the flanges 2021.

The housing 1 includes a receiving cavity 11 for receiving the CPU 200. The contacts 2 extend into the receiving cavity 11 for connecting the CPU 200. The retaining clip 3 is rotatable between an upstanding/open position and a horizontal/closed position and includes a receiving space 31 and an insertion opening 32 communicating the receiving space 31 with an exterior so as to allow the CPU 200 to be received within the receiving space 31 via the insertion opening 32. The retaining clip 3 includes a top wall 33 atop the receiving space 31, a pair of side walls 34 by two lateral sides of the receiving space 31, and a front/connecting wall 35 connected between the pair of side walls 34. Three positioning blocks 39 are formed on the top wall 33 corresponding to the pair of side walls 34 and the connecting wall 35 of the retaining clip 3 to surround the receiving space 31 for snugly receiving the base plate 201 in the receiving space 31.

The top wall 33 forms a center opening 37 communicating the receiving space 31 with an exterior in the vertical direction. A pair of retaining arms 331 are formed by two lateral sides of the center opening 37. Each retaining arm 331 forms a recess 332 to receive the lateral block 2022, and a sliding face 333 to ease insertion of the CPU 200 into the receiving space 31. During assembling the retainer assembly, the CPU 200 is inserted into the receiving space 31 via the insertion opening 32 along the insertion direction perpendicular to the vertical direction of the CPU 200. The retaining arms 331 move along the sliding grooves 203 and pass over the corresponding lateral blocks 2022, with minor deformation of the retaining clip 3 due to the inherent character of plastic material, to have the lateral blocks 2022 retained in the corresponding recess 332. The central protrusion 202 extends through the center opening 37 and above the top wall 33. In brief, when the retaining assembly is in the horizontal/closed position, the retaining arm 331 is sandwiched between the flanges 2021 and the base plate 201 in the vertical direction of the CPU 200 for securement along the vertical direction, the lateral blocks 2022 is received within the corresponding recess 332 for securement along the front-to-back direction, and the positioning blocks 39 corresponding to the side walls 34 commonly sandwich the base plate 201 in the transverse direction for securement in the transverse direction. Under such a situation, in the retaining assembly, the CPU 200 and the retaining clip 3 are immoveable with each other.

The retaining clip 3 includes a mounting part 36 secured to the printed circuit board 300 via the fixing piece 6, and a connecting part 38 linked to the mounting part 36 for allowing the retaining clip 3 to be rotatable with regard to the mounting part 36. The connecting part 38 forms a V-groove 381 for enhancing flexibility thereof and easing rotation of the retaining clip 3. The mounting part 36 has the mounting hole 361 to allow the fixing piece 6 to extend therethrough.

The connector 100 includes a mounting seat 7 and the securing pieces 8 securing the mounting seat 7 upon the printed circuit board 300. The lever 5 is pivotally mounted upon the mounting seat 7. The load plate or cover 4 is pivotally mounted to the lever 5. During assembling, the CPU 200 is assembled unto the retaining clip 3 when the retainer assembly is in the upstanding/open position, and the retainer assembly including both the retaining clip 3 and the CPU 200, is rotated to the horizontal/closed position upon the housing 1. Successively, the load plate 4 is rotated from an upstanding/open position to the horizontal/closed position upon the retaining assembly, and finally the locking section 42 of the load plate 4 is engaged with the fixing piece 6 by rotating the lever 5 wherein the pressing sections 41 of the load plate 4 downwardly press the corresponding lateral blocks 2022 to have the CPU 200 connect to the contacts 2 reliably. Understandably, the central protrusion 202 extends through the center opening 37 and enters the window 43 in the load plate 4 for contacting a base of a heat sink (not shown) for heat dissipation.

Notably, the features of the invention disclosed in both the embodiments are to provide the CPU with the sliding grooves to allow the retaining arms of the retaining clip to be assembled along the insertion direction perpendicular to the vertical direction of the CPU and finally received therein to commonly form the retainer assembly wherein an interengagement is formed between the retaining clip and the CPU in the front-to-back direction for preventing withdrawal of the CPU from the retaining clip in the insertion direction.

While preferred embodiments in accordance with the present disclosure have been shown and described, equivalent modifications and changes known to persons skilled in the art according to the spirit of the present disclosure are considered within the scope of the present disclosure as described in the appended claims.

What is claimed is:

1. An retainer assembly for use with an electrical connector, comprising:
    an insulative retaining clip forming a receiving space with an insertion opening to communicate with an exterior in a front-to-back direction, a top wall having a pair of retaining arms located above the receiving space and defining a center opening between said pair of retaining arms in a transverse direction perpendicular to the front-to-back direction, said center opening communicating with the receiving space in a vertical direction perpendicular to both the front-to-back direction and the transverse direction;
    a CPU (Central Processing Unit) including a base plate and a central protrusion extending upwardly from the base plate, the CPU defining a pair of sliding grooves on a pair of lateral sides spaced from each other in the transverse direction; wherein
    the CPU is assembled to the retaining clip along the front-to-back direction by the pair of retaining arms receivably moving along the pair of sliding grooves, respectively, and after assembled, the base plate is received in the receiving space and the central protrusion extends upwardly through the center opening and above the top wall.

2. The retainer assembly as claimed in claim 1, wherein the central protrusion further forms a pair of flanges on said pair of lateral sides, and the pair of sliding grooves are formed between the pair of flanges and the base plate in the vertical direction.

3. The retainer assembly as claimed in claim 2, wherein the central protrusion further forms a pair of platforms opposite to the pair of flanges in the vertical direction to commonly define the corresponding pair of sliding grooves therebetween in the vertical direction.

4. The retainer assembly as claimed in claim 3, wherein the central protrusion further includes a pair of lateral blocks coplanar with the pair of platforms.

5. The retainer assembly as claimed in claim 4, wherein each of said retaining arms further includes a recess aligned with the corresponding lateral block in the vertical direction.

6. The retainer assembly as claimed in claim 2, wherein the central protrusion further includes a pair of lateral blocks coplanar with the pair of flanges.

7. The retainer assembly as claimed in claim 6, wherein each of said retaining arms further includes a recess to snugly receive the corresponding lateral block so as to restrain relative movement between the retaining clip and the CPU in both the front-to-back direction and the transverse direction.

8. The retainer assembly as claimed in claim 1, wherein said retaining clip includes a seat part for mounting to a printed circuit board, and a connecting part flexibly connected between the seat part and the top wall so as to allow the retainer clip to be rotatable relative to the printed circuit board.

9. The retainer assembly as claimed in claim 1, wherein said retaining clip further includes a pair of side walls so as to form the receiving space therebetween in the transverse direction.

10. The retainer assembly as claimed in claim 1, wherein the pair of flanges are made of IHS (Integrated Heat Spreader) which is integrally formed with the CPU.

11. A method of making a retainer assembly comprising steps of:
    providing an insulative retaining clip with a receiving space which communicates with an exterior via an insertion opening in a front-to-back direction, and further with a top wall located above the receiving space in a vertical direction perpendicular to the front-to-back direction and having a pair of retaining arms with a center opening therebetween in a transverse direction perpendicular to both the front-to-back direction and the vertical direction;
    providing a CPU (Central Processing Unit) with a base plate and a central protrusions extending upwardly from the base plate and with a pair of sliding grooves on two lateral sides spaced from each other in the transverse direction; and
    assembling the CPU unto the retaining clip by moving the pair of retaining arms receive ably along the corresponding sliding grooves along the front-to-back direction until the base plate is fully received within the receiving space and the central protrusion is received in the center opening.

12. The method as claimed in claim 11, wherein said central protrusion further forms a pair of flanges above the pair of sliding grooves, respectively.

13. The method as claimed in claim 12, wherein said central protrusion further forms a pair of platforms to cooperate with the pair of flanges to define the pair of sliding grooves therebetween in the vertical direction.

14. The method as claimed in claim 13, wherein said central protrusion further forms a pair of lateral blocks coplanar with the pair of platforms, and the pair of retaining arms form a pair of recesses respectively aligned with the corresponding lateral blocks in the vertical direction.

15. The method as claimed in claim 12, wherein said central protrusions further forms a pair of lateral blocks coplanar with the pair of flanges, and the pair of retaining arms form a pair of recesses respectively receiving said corresponding lateral blocks therein.

16. An electrical connector assembly comprising:
    a printed circuit board;
    an electrical connector mounted upon the printed circuit board and including an insulative housing with a plurality of contacts therein;
    a mounting seat secured to the printed circuit board and located at one end of the housing in a front-to-back direction;
    a lever pivotally mounted to the mounting seat;
    a load plate pivotally mounted to the lever and having a locking section at a free end;
    a fixing piece secured to the other end of the housing, to which said locking section is detachably secured;
    a retainer assembly sandwiched between the load plate and the housing in a vertical direction perpendicular to the front-to-back direction, and including:

a plastic retaining clip forming a pair of retaining arms on thereof two lateral sides spaced from each other in a transverse direction perpendicular to both the front-to-back direction and the vertical direction;

a CPU (Central Processing Unit) forming a pair of front-to-back sliding grooves on thereof two lateral sides spaced from each other in the transverse direction; wherein the pair of retaining arms receivably move along the corresponding sliding grooves, respectively, to have the CPU assembled to the retaining clip.

17. The electrical connector assembly as claimed in claim 16, wherein the CPU forms a pair of lateral blocks and the load plate forms a pair of pressing sections respectively downwardly pressing the lateral blocks, respectively.

18. The electrical connector assembly as claimed in claim 17, wherein the retaining arms form a pair of recesses respectively aligned with the pair of lateral blocks either in a coplanar manner or in a higher level.

19. The electrical connector assembly as claimed in claim 16, wherein said retaining clip is either mounted to the printed circuit board via said fixing piece or independently sandwiched between the load plate and the housing.

20. The electrical connector assembly as claimed in claim 16, wherein said CPU includes a base plate and a central protrusion extending upwardly from the base plate, and a pair of flanges formed on the central protrusion in a coplanar manner to result in upper parts of the pair of sliding grooves.

* * * * *